United States Patent
Ghalebi

(10) Patent No.: US 10,638,647 B1
(45) Date of Patent: Apr. 28, 2020

(54) ATTACHING PRINTED CIRCUIT BOARD TO HEAT EXCHANGER

(71) Applicant: Xeleum Lighting, Boynton Beach, FL (US)

(72) Inventor: Mehrdad Ghalebi, Peekskill, NY (US)

(73) Assignee: Xeleum Lighting, Boynton Beach, FL (US)

( * ) Notice: Subject to any disclaimer, the term of this patent is extended or adjusted under 35 U.S.C. 154(b) by 0 days.

(21) Appl. No.: 16/054,277

(22) Filed: Aug. 3, 2018

Related U.S. Application Data

(60) Provisional application No. 62/612,412, filed on Dec. 30, 2017.

(51) Int. Cl.
   *H05K 7/20* (2006.01)
   *H05K 1/02* (2006.01)

(52) U.S. Cl.
   CPC ......... *H05K 7/20909* (2013.01); *H05K 1/021* (2013.01); *H05K 1/0212* (2013.01); *H05K 7/20509* (2013.01); *H05K 2201/10106* (2013.01)

(58) Field of Classification Search
   CPC ....... H01L 23/4093; H01L 2224/45124; H01L 2924/013; H01L 2924/12044; H01L 2924/12041; H05K 1/0203; H05K 7/20418; H05K 1/181; H05K 3/0061; H05K 7/20409; H05K 7/1404; H05K 3/325; H05K 7/12; H05K 2201/10393; H05K 7/2049
   See application file for complete search history.

(56) References Cited

U.S. PATENT DOCUMENTS

| | | | | |
|---|---|---|---|---|
| 3,309,579 | A * | 3/1967 | St. Louis et al. ... | H01L 23/3677 257/717 |
| 5,208,731 | A * | 5/1993 | Blomquist .......... | H01L 23/4093 174/16.3 |
| 6,229,706 | B1 * | 5/2001 | Cook .................. | H01L 23/4093 24/458 |
| 6,462,951 | B2 * | 10/2002 | Letourneau ......... | H01L 23/4093 165/185 |
| 6,496,372 | B1 * | 12/2002 | Davison ............. | H01L 23/4093 165/80.3 |
| 6,724,629 | B1 * | 4/2004 | Augustin ............ | H01L 23/4093 165/80.3 |
| 7,187,553 | B2 * | 3/2007 | Schmidberger ..... | H01L 23/4006 165/185 |
| 9,249,966 | B1 * | 2/2016 | Hooi ....................... | F21V 29/74 |
| 9,668,335 | B1 * | 5/2017 | Canseco ............. | H05K 1/0203 |
| 2002/0195262 | A1 * | 12/2002 | Kirchberger ......... | H02M 7/003 174/521 |
| 2003/0011993 | A1 * | 1/2003 | Summers ............ | H01L 23/4093 361/704 |
| 2005/0265019 | A1 * | 12/2005 | Sommers ............... | A47F 3/001 362/217.16 |
| 2006/0139886 | A1 * | 6/2006 | Barsun ................ | H01L 23/4006 361/704 |

(Continued)

*Primary Examiner* — Adam B Dravininkas
(74) *Attorney, Agent, or Firm* — Lowenstein Sandler LLP

(57) ABSTRACT

An example method of attaching a printed circuit board (PCB) to a heat exchanger comprises: providing a heat exchanger comprising a base plate and two ridges attached to the base plate, wherein the ridges form a splayed channel; placing a printed circuit board (PCB) into the splayed channel; and squeezing the ridges of the splayed channel towards a longitudinal axis of the splayed channel.

20 Claims, 4 Drawing Sheets

(56) References Cited

U.S. PATENT DOCUMENTS

| | | | |
|---|---|---|---|
| 2006/0146502 A1* | 7/2006 | Mayer | F21V 19/0045 361/720 |
| 2007/0109751 A1* | 5/2007 | Mayer | F21V 19/0045 361/719 |
| 2009/0168360 A1* | 7/2009 | Negrut | H01L 23/4006 361/710 |
| 2009/0213550 A1* | 8/2009 | Hongo | G06F 1/203 361/704 |
| 2009/0219713 A1* | 9/2009 | Siemiet | F21V 3/02 362/218 |
| 2009/0316404 A1* | 12/2009 | Mo | F21S 8/086 362/249.01 |
| 2011/0031864 A1* | 2/2011 | Rebergen | F21K 9/00 313/11 |
| 2011/0111536 A1* | 5/2011 | Brunner | F21K 9/00 438/26 |
| 2011/0220338 A1* | 9/2011 | Chang | F21V 19/0015 165/185 |
| 2012/0147603 A1* | 6/2012 | Hochstein | F21V 29/004 362/247 |
| 2012/0314431 A1* | 12/2012 | Lin | F21V 19/0045 362/382 |
| 2016/0181714 A1* | 6/2016 | Chawla | H05K 7/1069 361/679.31 |
| 2018/0320883 A1* | 11/2018 | Musser | F21V 29/89 |
| 2018/0320885 A1* | 11/2018 | Musser | F21V 29/89 |

* cited by examiner

US 10,638,647 B1

ATTACHING PRINTED CIRCUIT BOARD TO HEAT EXCHANGER

REFERENCE TO RELATED APPLICATIONS

This application claims the benefit of U.S. Patent Application No. 62/612,412, filed Dec. 30, 2017, the entirety of which is incorporated herein by reference.

TECHNICAL FIELD

The present disclosure is generally related to methods of efficient heat removal from light emitting devices mounted on printed circuit boards (PCBs), and is specifically related to methods of attaching a PCB to a heat exchanger.

BACKGROUND

Electric current flowing through a circuit inevitable produces a certain amount of heat. For certain devices, such as light-emitting diode (LED)-based lighting devices, the amount of heat generated by the device is very significant, and thus effective heat removal becomes essential.

BRIEF DESCRIPTION OF THE DRAWINGS

The present disclosure is illustrated by way of examples, and not by way of limitation, and may be more fully understood with references to the following detailed description when considered in connection with the figures, in which.

DETAILED DESCRIPTION

Described herein are methods of attaching printed circuit boards (PCBs) to heat exchangers.

Various devices (e.g., lighting fixtures) may employ metal core PCBs for mounting light emitting diodes (LEDs). A typical metal core PCB includes a base layer, a dielectric layer, and a conductive coating. The base layer may be provided by a metal sheet (e.g., made of an aluminum-based alloy). The dielectric layer isolates the base layer from the copper foil, while ensuring efficient heat transfer between the two layers. The dielectric layer may be made of polymers, ceramics, epoxies, and/or various combinations of the above listed and other suitable materials. The conductive coating may be provided by metal (e.g., copper) foil, which may be processed to form a plurality of electrical conductors. Using a metal core instead of a laminate material in PCB production provides a much more efficient heat removal, such that the heat generated by the components installed on the PCB is efficiently transferred to a heat exchanger to which the PCB is mounted.

The heat exchanger may be provided by a metallic article, the form factor of which is designed to maximize the cooling surface in order to provide the efficient heat dissipation. In various illustrative examples, a heat exchanger may include the base plate, to which multiple flat or pin fins may be attached, and may be arranged in a parallel, radial, or spiral manner; the heat exchanger may further include one or more horizontal plates (caps) placed across the top of the fins.

In various common implementations, attaching a PCB to the heat exchanger may involve drilling one or more sets of matching orifices in the PCB and a surface of the heat exchanger and then using screws to firmly attach the PCB to the surface. However, the drilling and screwing operations may not exert uniform contact along the full length of the PCB and the heat exchanger and/or may increase the cost of the assembly beyond an economically feasible value. Various alternative implementations may have other notable drawbacks.

Devices and methods of the present disclosure alleviate the above-noted and other known deficiencies of various common implementations by providing a heat exchanger having a base plate and two ridges attached to the base plate, such that the ridges form a splayed channel; an example method of attaching a PCB to the heat exchanger involves applying a thermal conductive material to the base of the splayed channel, placing a printed circuit board (PCB) into the splayed channel, and squeezing the ridges of the splayed channel towards the longitudinal axis of the base of the splayed channel, as described in more detail herein below with references to FIGS. 1-4. Various aspects of the above referenced methods and devices are described in detail herein below by way of examples, rather than by way of limitation.

Figure 1:
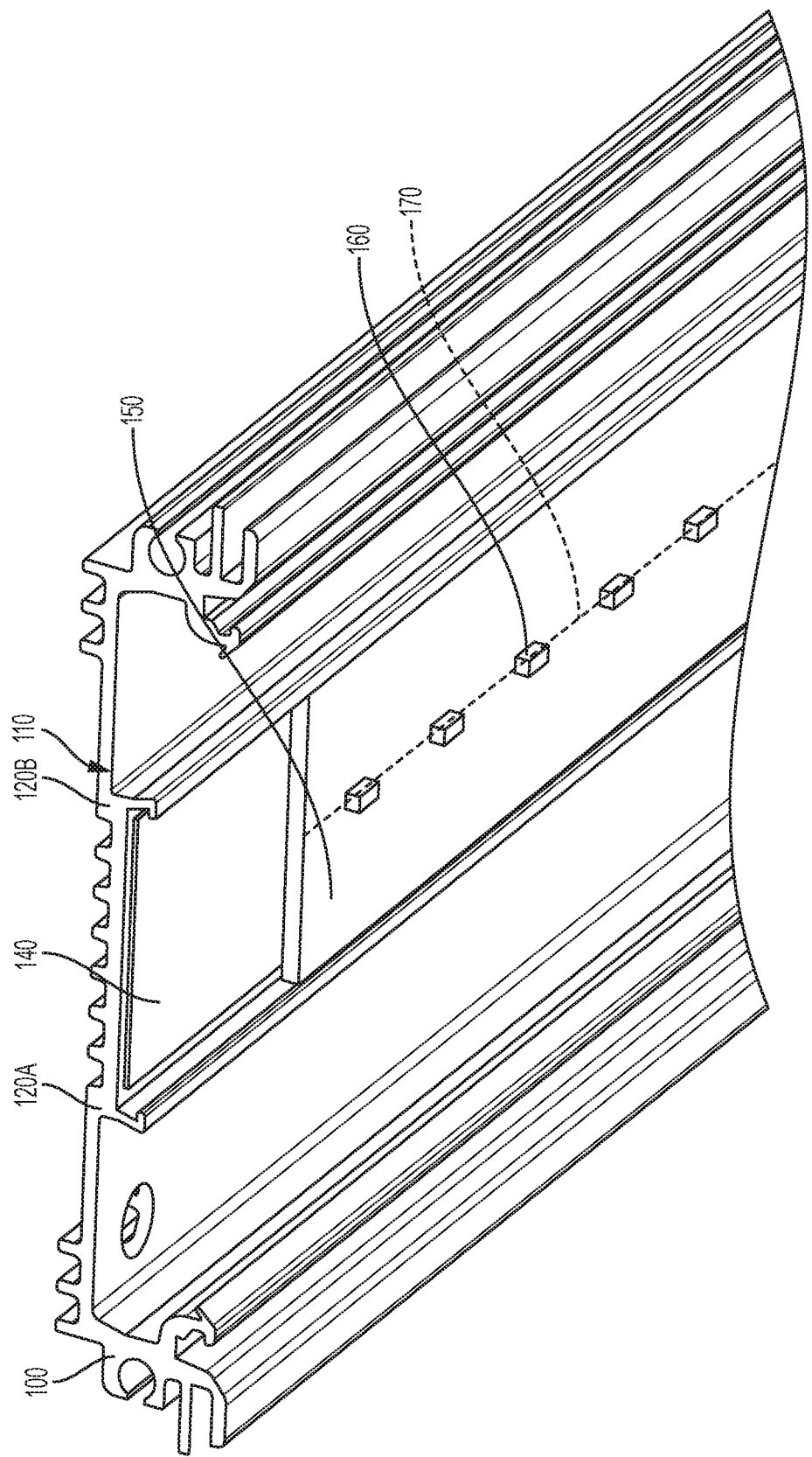
FIG. 1 schematically illustrates an isometric view of an example PCB and heat exchanger assembly implemented in accordance with one or more aspects of the present disclosure.

FIG. 1 schematically illustrates an isometric view of an example PCB and heat exchanger assembly implemented in accordance with one or more aspects of the present disclosure. As shown in FIG. 1, the heat exchanger 100 may include a base plate 110. In various illustrative examples, the base plate may include various fins, such as flat-shaped or pin-shaped fins. The heat exchanger 100 may further include two ridges 120A and 120B which are attached to the base plate 110 thus forming the splayed channel 130. The term "splayed" refers to the arrangement of the ridges, whereby at least one of the ridges deviates, by a relatively small acute angle, from a surface normal of the base plate 110, while the straight lines formed by intersections of respective ridges with the base plate are substantially parallel. The base 140 of the splayed channel 130 may be coated with a layer of a thermal conductive material (e.g., thermal transfer paste), which ensures efficient heat transfer between the PCB 150 and the heat exchanger 100. The PCB 150, which may be provided by a metal core PCB, may have a plurality of LEDs 160 and/or other components mounted on its surface.

Figure 2A:
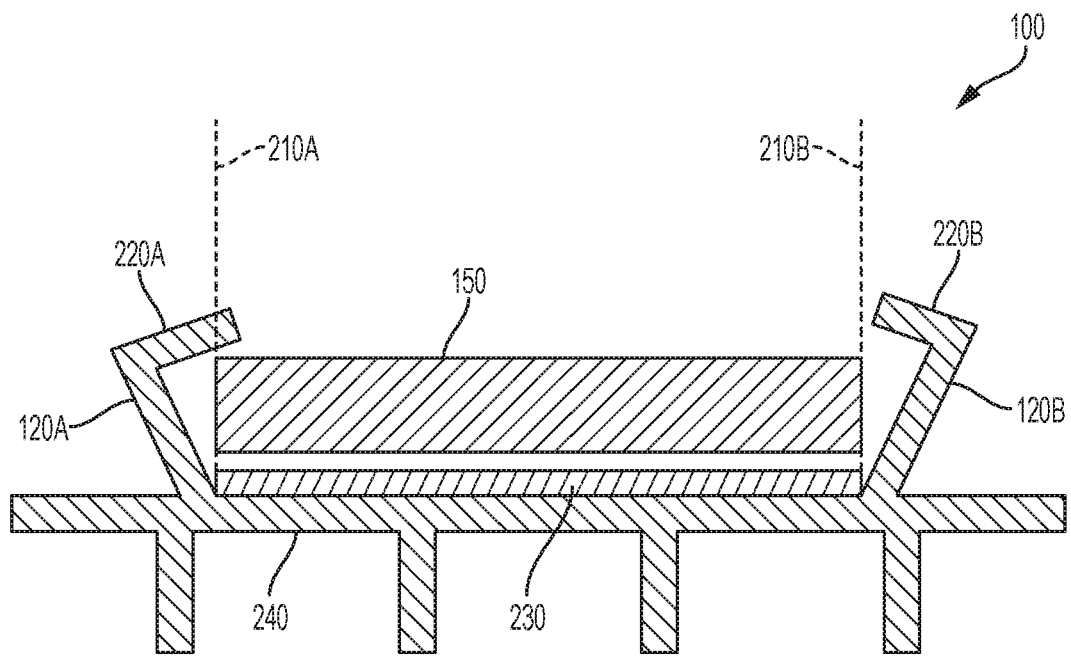
FIG. 2A schematically illustrates a transverse cross-section of an example heat exchanger implemented in accordance with one or more aspects of the present disclosure.

FIG. 2A schematically illustrates a transverse cross-section of an example heat exchanger 100 (i.e., a cross-section in a plane which is orthogonal to the longitudinal axis of the heat exchanger) implemented in accordance with one or more aspects of the present disclosure. As shown in FIG. 2A, the heat exchanger 100 includes two ridges 120A and 120B which are attached to the base plate 110 and form a splayed channel 130. Each of the ridges 120A-120B deviates, by a relatively small acute angle (e.g., less than 15 degrees), from a respective surface normal 210A-210B of the base plate 110. Each of the ridges 120A-120B has a respective longitudinal overhanging element 220A-220B which extends towards the longitudinal axis 170 of the base of the splayed channel 130; thus, the overhanging elements 220 are designed to steadily hold the PCB 150 in its position, whereby the PCB 150 is firmly pressed to the base 140 of the splayed channel 130 coated with a layer of a thermal conductive material 230. In the illustrative example of FIG. 2, the transverse cross-section of the ridge 120 is a rotated L-shape, in which the horizontal element of the "L" corresponds to the overhanging element 220.

Figure 2B:
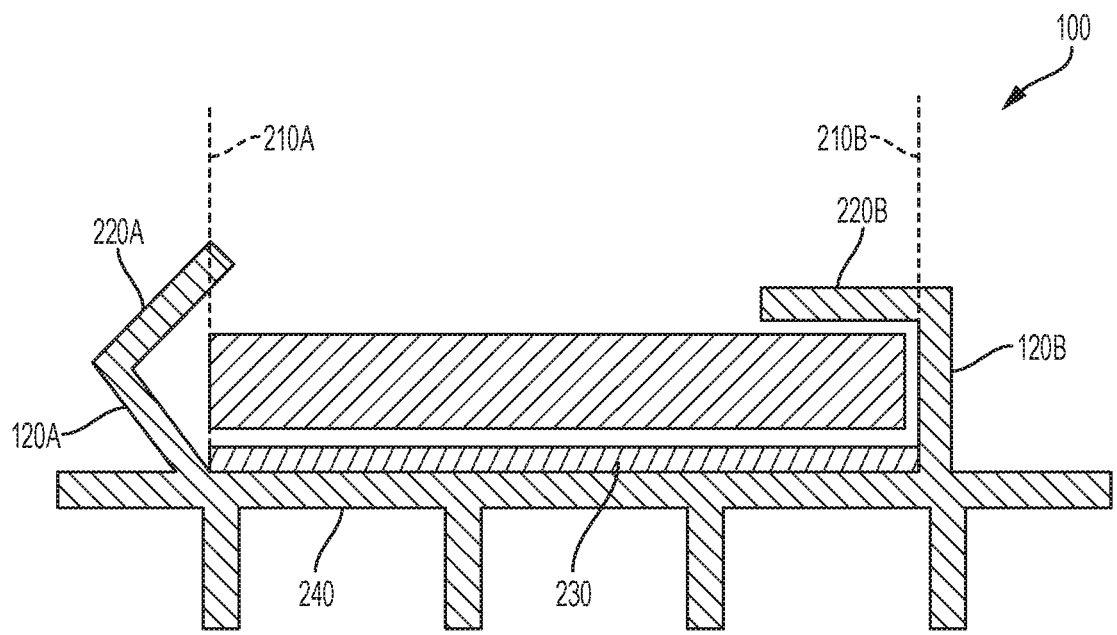
FIG. 2B schematically illustrates a transverse cross-section of another example heat exchanger implemented in accordance with one or more aspects of the present disclosure.

Alternatively, as shown in FIG. 2B, only one of the two L-shaped ridges, e.g., the ridge 120A, may deviate, by a relatively small acute angle (e.g., less than 15 degrees), from the surface normal 210A of the base plate 110, while the other ridge 120B may be parallel to the surface normal 210B.

Figure 3:
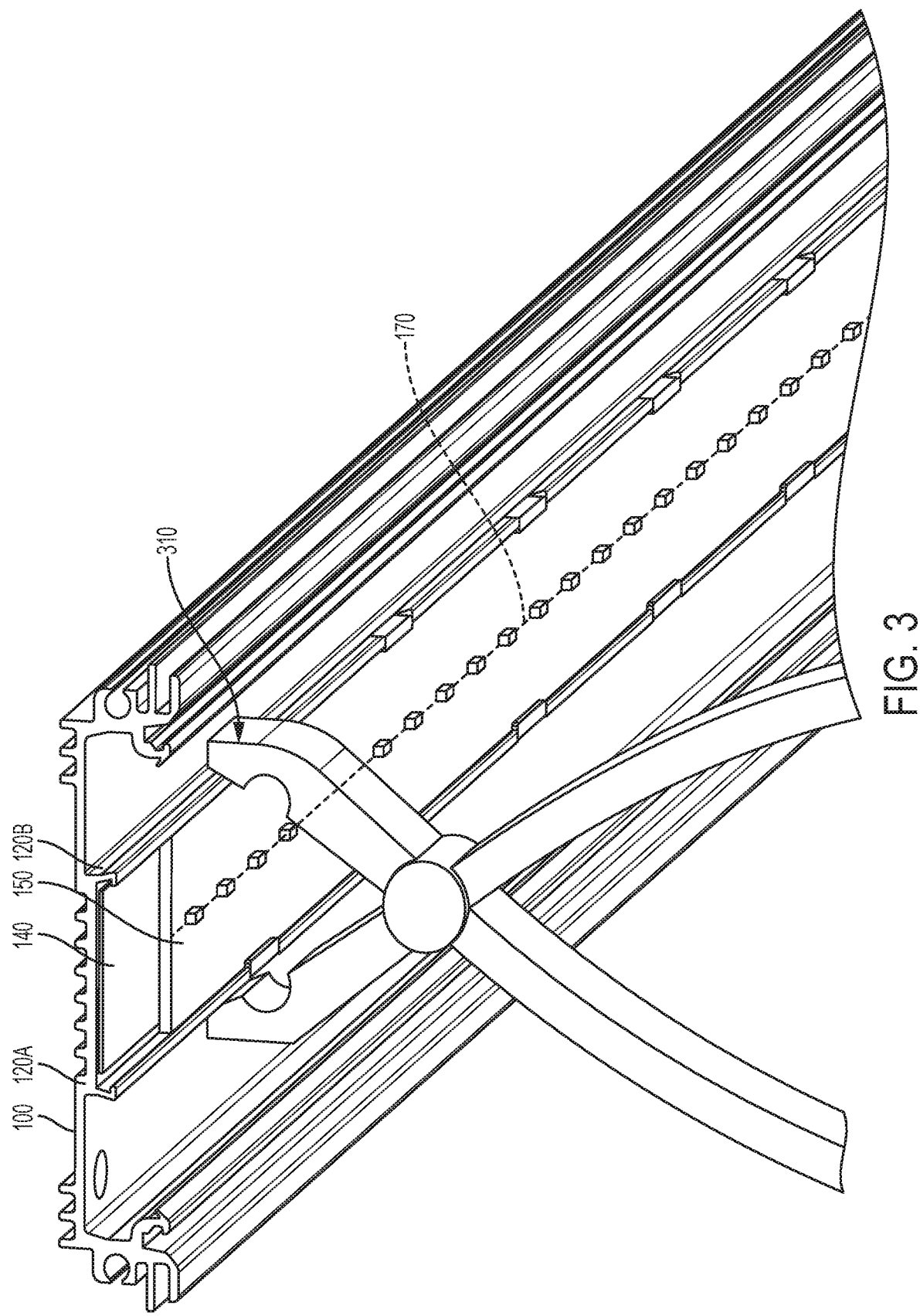
FIG. 3 schematically illustrates attaching a PCB to the example heat exchanger implemented in accordance with one or more aspects of the present disclosure.

FIG. 3 schematically illustrates attaching the PCB 150 to the heat exchanger 100, in accordance with one or more aspects of the present disclosure. As noted herein above, for the symmetric heat exchanger implementation of FIG. 2A, attaching the PCB 150 to the heat exchanger may involve placing the PCB 150 into the splayed channel 130, and squeezing the ridges 120A-120B towards the longitudinal axis 170 of the base of the splayed channel 130. For the asymmetric heat exchanger implementation of FIG. 2B, attaching the PCB 150 to the heat exchanger may involve placing the PCB 150 in the splayed channel 130 by transversely sliding the PCB 150 under the fixed L-shaped ridge 120B and applying a transversal force to the splayed L-shaped ridge 120A towards the longitudinal axis 170 of the base of the splayed channel 130.

The squeezing operation may be performed by a common tool (e.g., a pair of pliers 310) or a specialized tool which may be employed by an automated production line. The squeezing operation ensures that the PCB 150 is fixed in its position by the overhanging elements 220A-220B of the ridges 120A-120B and is pressed towards the base 140 of the splayed channel 130. The squeezing operation may be performed by applying the squeezing tool in several positions along the ridges 120A-120B, thus ensuring the uniform longitudinal alignment of the ridges 120A-120B and the uniform distribution of the force which firmly presses the PCB 150 to the base 140 of the splayed channel 130.

Figure 4:
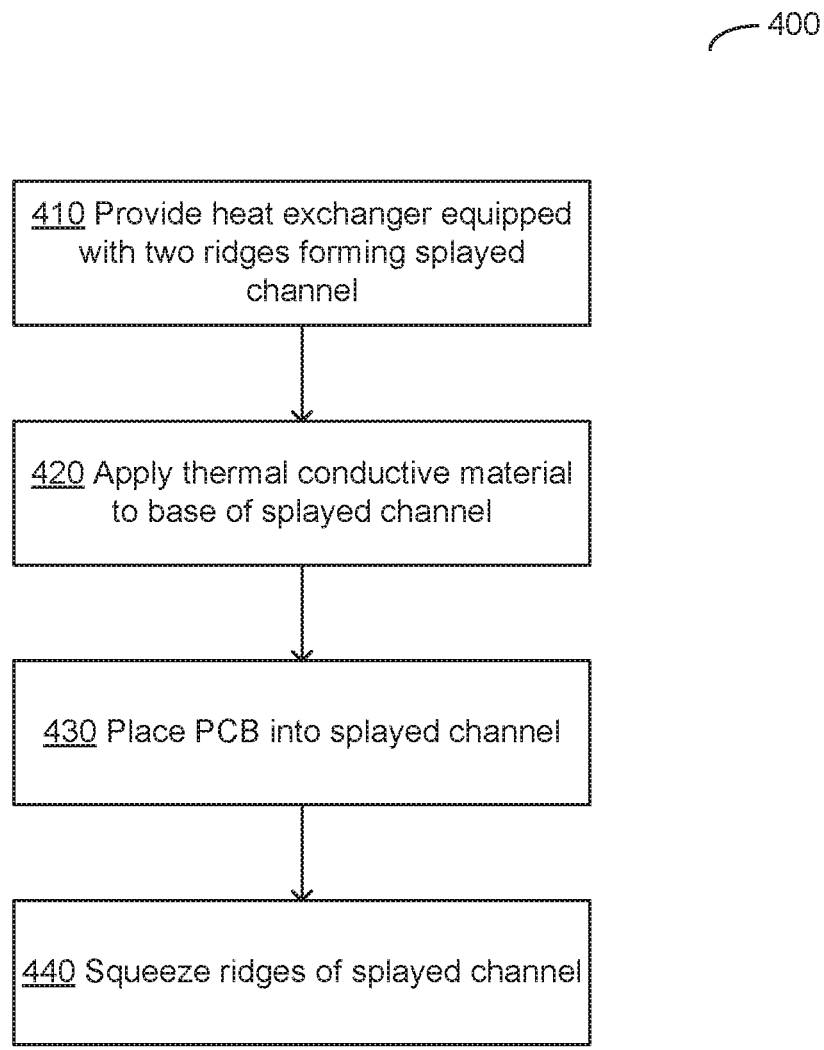
FIG. 4 schematically illustrates a flowchart of an example method of attaching a printed circuit board (PCB) to a heat exchanger, in accordance with one or more aspects of the present disclosure.

FIG. 4 schematically illustrates a flowchart of an example method of attaching a PCB to a heat exchanger, in accordance with one or more aspects of the present disclosure. Operations of method 400 may be performed, e.g., by an industrial robot. The operations may be performed in the order in which they are described or in any other order; at least some of the operations may be performed simultaneously, while other operations may be performed sequentially with respect to each other.

The operation 410 may involve providing a heat exchanger which includes the base plate to which two L-shaped ridges are attached to form a splayed channel, such that at least one of the two L-shaped ridges deviates, by a relatively small acute angle, from a surface normal of the base plate of the heat exchanger. The heat exchanger may further include multiple flat or pin fins attached to the base plate; the fins may be arranged in a parallel, radial, or spiral manner. The heat exchanger may further include one or more horizontal plates (caps) placed across the top of the fins, as described in more detail herein above.

The operation 420 may involve applying a thermal conductive material to the base of the splayed channel, thus ensuring efficient heat transfer between the PCB and the heat exchanger. In various illustrative examples, thermal conductive material may be provided by silicone rubber or other polymer-based material), which ensures efficient heat transfer between the PCB and the heat exchanger, as described in more detail herein above.

The operation 430 may involve placing the PCB into the splayed channel. Placing the PCB into the splayed channel may involve bringing the PCB into a spatial vicinity of the splayed channel while the PCB is substantially parallel to the base plate, such that a projection of the PCB on the base plate falls within the splayed channel, and then applying a transverse force to press the PCB towards the layer of the thermal conductive material applied to the base plate, as described in more detail herein above.

The operation 440 may involve squeezing the ridges of the splayed channel towards the longitudinal axis of the splayed channel. Squeezing the ridges may involve applying, to at least one of the ridges, a transverse force towards the longitudinal axis of the splayed channel, until the ridges become substantially parallel to each other. The squeezing operation may be performed in several positions along the ridges, thus ensuring the uniform longitudinal alignment of the ridges and the uniform distribution of the force which firmly presses the PCB to the base of the splayed channel, as described in more detail herein above. Upon completing the operation 440, the method may terminate.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method, comprising:
   providing a heat exchanger comprising a base plate and two ridges attached to the base plate, wherein the ridges form a splayed channel,
   wherein a first ridge of the two ridges comprises a first longitudinal overhanging element extending towards a longitudinal axis of a base of the splayed channel, such that a transverse cross-section of the first ridge is a first L-shape, wherein a horizontal element of the first L-shape corresponds to the first longitudinal overhanding element, and
   wherein a second ridge of the two ridges comprises a second longitudinal overhanging element extending towards the longitudinal axis of the base of the splayed channel, such that a transverse cross-section of the second ridge is a second L-shape, wherein a horizontal element of the second L-shape corresponds to the second longitudinal overhanding element;
   placing a printed circuit board (PCB) into the splayed channel; and
   applying, to at least one of the two ridges, a transverse force towards a longitudinal axis of the splayed channel, until a first external surface of the first ridge is substantially parallel to a second external surface of the second ridge.

2. The method of claim 1, wherein placing the PCB into the splayed channel further comprises:
applying a thermal conductive material to a base of the splayed channel.

3. The method of claim 1, wherein placing the PCB into the splayed channel further comprises:
bringing the PCB into a spatial vicinity of the splayed channel while the PCB is substantially parallel to the base plate such that a projection of the PCB on the base plate falls within the splayed channel.

4. The method of claim 1, wherein placing the PCB into the splayed channel further comprises:
applying the transverse force to press the PCB towards a layer of a thermal conductive material applied to the base plate.

5. The method of claim 1, wherein a first straight line formed by a first intersection of the first ridge with the base plate is substantially parallel to a second straight line formed by a second intersection of the second ridge.

6. The method of claim 1, wherein the first ridge deviates, by an acute angle not exceeding 15 degrees, from a surface normal of the base plate.

7. The method of claim 6, wherein the second ridge is parallel to the surface normal of the base plate.

8. The method of claim 7, wherein placing the PCB into the splayed channel further comprises:
transversely sliding the PCB under the second ridge.

9. The method of claim 1, wherein applying the transverse force further comprises:
applying a squeezing tool in several positions along the first ridge to ensure a uniform longitudinal alignment of the first ridge and the second ridge.

10. The method of claim 1, wherein the PCB is provided by a metal core PCB.

11. A method, comprising:
placing a printed circuit board (PCB) into a splayed channel formed by two ridges attached to a base plate of a heat exchanger,
wherein a first ridge of the two ridges comprises a first longitudinal overhanging element extending towards a longitudinal axis of a base of the splayed channel, such that a transverse cross-section of the first ridge is a first L-shape, wherein a horizontal element of the first L-shape corresponds to the first longitudinal overhanging element, and
wherein a second ridge of the two ridges comprises a second longitudinal overhanging element extending towards the longitudinal axis of the base of the splayed channel, such that a transverse cross-section of the second ridge is a second L-shape, wherein a horizontal element of the second L-shape corresponds to the second longitudinal overhanding element;
applying a thermal conductive material to a base of the splayed channel; and
applying, to at least one of the two ridges, a transverse force towards a longitudinal axis of the splayed channel, until a first external surface of the first ridge is substantially parallel to a second external surface of the second ridge.

12. The method of claim 11, wherein placing the PCB into the splayed channel further comprises:
bringing the PCB into a spatial vicinity of the splayed channel while the PCB is substantially parallel to the base plate such that a projection of the PCB on the base plate falls within the splayed channel.

13. The method of claim 11, wherein placing the PCB into the splayed channel further comprises:
applying the transverse force to press the PCB towards a layer of a thermal conductive material applied to the base plate.

14. The method of claim 11, wherein a first straight line formed by a first intersection of the first ridge with the base plate is substantially parallel to a second straight line formed by a second intersection of the second ridge with the base plate.

15. The method of claim 11, wherein the first ridge deviates, by an acute angle not exceeding 15 degrees, from a surface normal of the base plate.

16. A heat exchanger, comprising:
a base plate;
a plurality of fins attached to the base plate; and
two ridges attached to the base plate, wherein the two ridges form a splayed channel configured to receive a printed circuit board (PCB),
wherein a first external surface of a first ridge of the two ridges is substantially parallel to a second external surface of a second ridge of the two ridges,
wherein the first ridge comprises a first longitudinal overhanging element extending towards a longitudinal axis of a base of the splayed channel, such that a transverse cross-section of the first ridge is a first L-shape, wherein a horizontal element of the first L-shape corresponds to the first longitudinal overhanding element, and
wherein the second ridge comprises a second longitudinal overhanging element extending towards the longitudinal axis of the base of the splayed channel, such that a transverse cross-section of the second ridge is a second L-shape, wherein a horizontal element of the second L-shape corresponds to the second longitudinal overhanding element.

17. The heat exchanger of claim 16, wherein a first straight line formed by a first intersection of the first ridge with the base plate is substantially parallel to a second straight line formed by a second intersection of the second ridge with the base plate.

18. The heat exchanger of claim 16, wherein the first ridge deviates, by an acute angle not exceeding 15 degrees, from a surface normal of the base plate.

19. The heat exchanger of claim 16, wherein a base of the splayed channel is coated with a layer of a thermal conductive material.

20. The heat exchanger of claim 16, further comprising:
one or more horizontal plates disposed across the plurality of fins.

* * * * *